United States Patent
Ziani et al.

(10) Patent No.: US 8,342,229 B1
(45) Date of Patent: *Jan. 1, 2013

(54) METHOD OF MAKING A CIG TARGET BY DIE CASTING

(75) Inventors: Abdelouahab Ziani, Santa Clara, CA (US); Daniel R. Juliano, Santa Clara, CA (US)

(73) Assignee: MiaSole, Santa Clara, CA (US)

(*) Notice: Subject to any disclaimer, the term of this patent is extended or adjusted under 35 U.S.C. 154(b) by 255 days.

This patent is subject to a terminal disclaimer.

(21) Appl. No.: 12/588,579

(22) Filed: Oct. 20, 2009

(51) Int. Cl.
*B22D 17/08* (2006.01)
*B22D 19/04* (2006.01)

(52) U.S. Cl. .......................... 164/98; 164/113

(58) Field of Classification Search ................. 164/113, 164/98
See application file for complete search history.

(56) References Cited

U.S. PATENT DOCUMENTS

| | | |
|---|---|---|
| 3,902,544 A | 9/1975 | Flemings et al. |
| 3,948,650 A | 4/1976 | Flemings et al. |
| 4,089,680 A | 5/1978 | Flemings et al. |
| 4,103,730 A | 8/1978 | Dussart |
| 4,150,712 A | 4/1979 | Dussart |
| 4,178,979 A | 12/1979 | Birat et al. |
| 4,200,137 A | 4/1980 | Zavaras et al. |
| 4,229,210 A | 10/1980 | Winter et al. |
| 4,824,735 A * | 4/1989 | McGill et al. ................. 428/610 |
| 5,343,926 A | 9/1994 | Cheskis et al. |
| 5,401,539 A | 3/1995 | Coombs et al. |
| 5,699,850 A | 12/1997 | Beitelman et al. |
| 6,070,643 A | 6/2000 | Colvin |
| 6,478,842 B1 | 11/2002 | Gressel et al. |
| 6,739,384 B2 | 5/2004 | Schoen et al. |
| 7,544,884 B2 | 6/2009 | Hollars |
| 2003/0052000 A1 * | 3/2003 | Segal et al. ............. 204/298.13 |
| 2007/0093059 A1 | 4/2007 | Basol |
| 2008/0105542 A1 * | 5/2008 | Purdy et al. ............. 204/298.13 |
| 2008/0121137 A1 | 5/2008 | Van Osten et al. |
| 2008/0145692 A1 | 6/2008 | Ziani |
| 2010/0116341 A1 * | 5/2010 | Huang et al. .................. 136/262 |

OTHER PUBLICATIONS

U.S. Appl. No. 12/588,578, filed Oct. 20, 2009, Juliano et al.
Atkinson, Helen, "Stirring Metals", Ingenia, Mar. 2006, 26:19-23.
Gabel, Howard, "Tech Spotlight: Kinetic Metallization Compared with HVOF," Adv. Mat. Proc., May 2004, 47-48.
MDA Technology Applications Report, "Coatings" 2004, 2 pages.

* cited by examiner

*Primary Examiner* — Kuang Lin
(74) *Attorney, Agent, or Firm* — The Marbury Law Group PLLC

(57) ABSTRACT

A method of making a sputtering target includes providing a backing structure, and forming a die cast copper indium gallium sputtering target material on the backing structure.

22 Claims, 6 Drawing Sheets

METHOD OF MAKING A CIG TARGET BY DIE CASTING

BACKGROUND

The present invention is directed to a method of making sputtering targets in general and to a copper indium gallium sputtering target and method of making thereof by die casting in particular.

Sputtering techniques are useful in various ways, such as deposition processes used in the fabrication of various products. A component of such sputtering techniques is a sputtering target. In such deposition techniques, the material of the sputtering target is deposited onto a substrate.

SUMMARY

A method of making a sputtering target includes providing a backing structure, and forming a die cast copper indium gallium sputtering target material on the backing structure.

DESCRIPTION OF THE EMBODIMENTS

Figure 1:
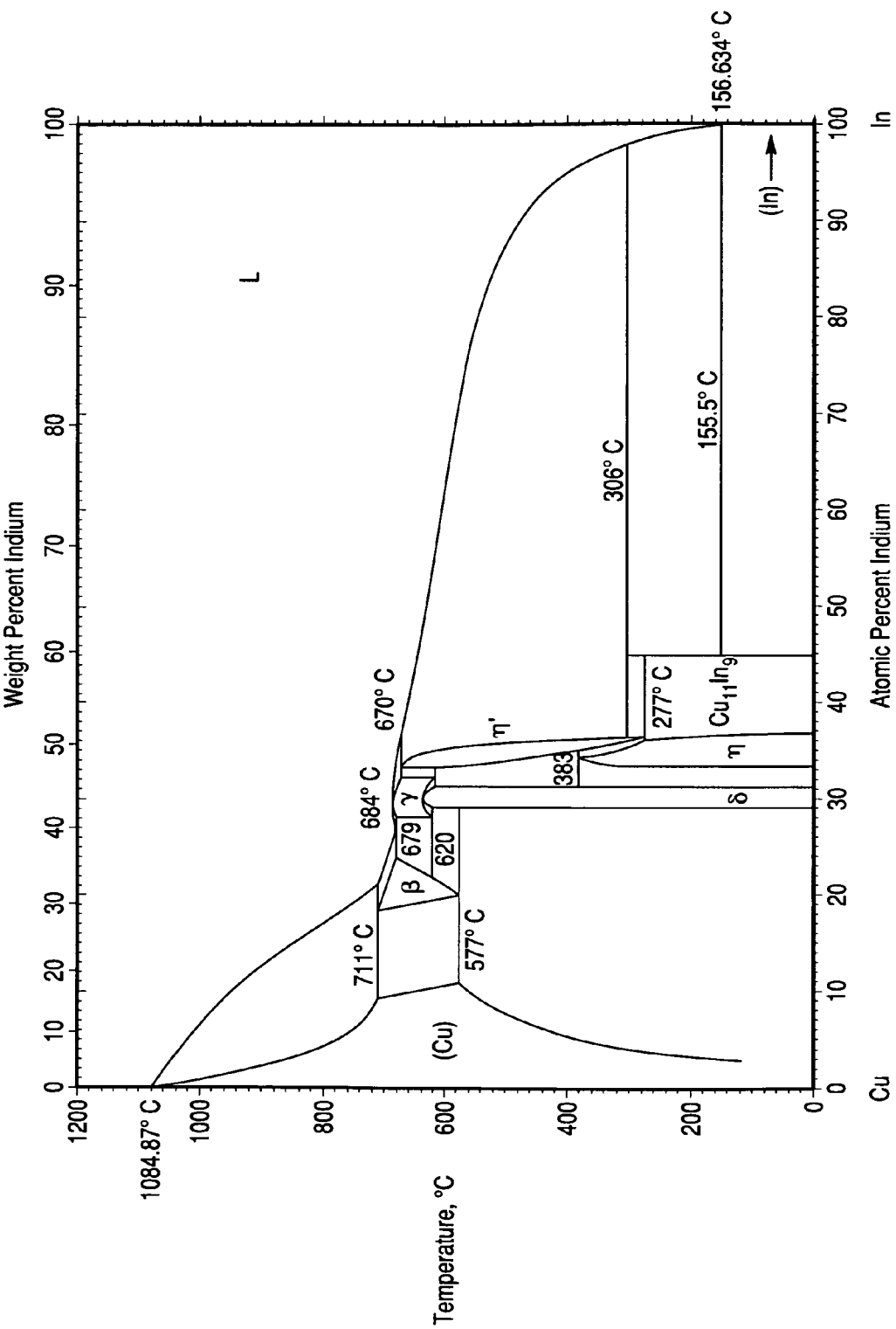
FIG. 1 is the copper-indium phase diagram.

One consideration in selecting and developing sputtering targets is the material to be used in such sputtering targets. Various materials that initially appear to be attractive selections impose manufacturing challenges, particularly from a metallurgical standpoint and particularly when forming the material into a cylindrical or tubular shape. Another consideration is that many monolithic targets formed without a backing tube are not adequate to accommodate water cooling which is provided to the magnets and target assembly during a sputtering operation. Due to this, sputtering materials must often be either bonded to a backing tube or directly formed onto a backing tube, such as a backing tube made from stainless steel or other suitable material.

An exemplary sputtering technique is magnetron sputtering which utilizes magnetrons. Examples of such magnetron sputtering techniques, such as planar magnetron sputtering and rotary magnetron sputtering are discussed in U.S. Pat. No. 7,544,884, issued on Jun. 9, 2009, and which is hereby incorporated by reference in its entirety.

Rotary magnetron sputtering uses cylindrical sputtering targets that include a tube that forms the target material and at least one magnet located inside the tube. Due to the continuous displacement of the magnetic flux lines running through the tube wall as the tube is rotated around the magnets, circumferentially uniform erosion is achieved at the surface of the sputtering target. Such an erosion profile results in higher utilization of the target material in comparison to the erosion profiles provided by other sputtering techniques, such as those employing stationary, planar magnetrons.

One example of a sputtering application is the deposition of materials for solar cells. Copper indium selenide ("CIS") and copper indium gallium selenide ("CIGS") materials have been recognized as effective p-type solar cell absorber layer materials for the production of high efficiency, low cost, and large scale solar cells. Copper indium selenide and copper indium gallium selenide materials may be formed by a reactive sputtering from a copper indium or copper indium gallium ("CIG") sputtering targets, respectively, in a selenium containing ambient, such as selenium gas or hydrogen selenide gas.

CIG alloys possess a large freezing range, with a liquidus temperature over 500° C., often around 650° C., and a solidus temperature of below 160° C. A significant volume change is associated with the solidification and thermal contraction that often occurs over such a wide temperature range. Thus, a substantial amount of shrinkage occurs during solidification of such alloys. Sputtering targets, long in one dimension, having narrow sections and thin walled features, for example, can have porosity due to extensive solidification shrinkage. Inclusions and structural defects, such as voids and porosity, are detrimental to sputtering processes, because such defects can cause arcing and electrical discharges that result in particle generation and the development of thin film anomalies. Phase heterogeneities, such as large areas of indium or copper, can also be detrimental to the sputtering process, so it is desirable that the target material possess a fine-scale microstructure, which is obtained by employing sufficiently rapid cooling during solidification. In addition, large scale variations of composition within a target can lead to sputtered thin films of variable properties across their area and, as a consequence, reduced yield, so the method of CIG target production must limit the amount of macroscopic segregation of constituent elements.

For example, the embodiments of the present invention provide methods of forming a copper indium gallium ("CIG") alloy sputtering target material. The CIG sputtering target material may be formed directly onto a backing structure, such as a cylindrical backing tube. Alternatively, CIG segments may be formed separately and then bonded to the backing tube.

Preferably, the CIG sputtering target material has a composition of about 29-39 wt % copper, about 49-62 wt % indium, and about 8-16 wt % gallium, Preferably, the sputtering target material has an overall uniform composition, whereby the wt % of each of these 3 primary elements, of samples taken from any 2 random locations of the target, as determined by reliable analytical procedures of a material volume of at least 10 mm$^3$, does not vary relatively by more than 5%, and more preferably not more than 2%. Typically the microstructure of CIG consists of a primary, Cu—Ga-rich intermetallic phase in an indium-rich matrix.

The sizes of the primary phase regions are determined using the planimetric technique described in section 12.5 of ASTM standard E1382-97 (2004) and using ASTM E562-08 to calculate volume fraction, in each case substituting primary phase "region" for "grain". Each primary phase "region" is defined as an entity visible in cross section under SEM with discernable boundaries and surrounded by the indium-rich matrix. In some cases, primary phase regions may have visible cracks but no matrix in the crack, in which case this is still counted as a single primary phase region. Preferably, between 0% and 10%, for instance 1% to 5%, of the primary phase regions (each comprising more than about 40 wt % copper) are of size greater than 100 μm in a random 1 cm by 1 cm area of the sputtering target. More preferably, between 0% and 10%, for instance 1% to 5%, of the primary phase regions are of size greater than 50 µm. Preferably, the average size of the primary phase region is no greater than 40 µm. More preferably, the average primary phase region size is 1 to 25 µm, such as 10 to 20 µm.

Preferably, the CIG sputtering target material has a density of 100% or more, as determined by the rule of mixtures applied to the densities of the component elements. The density determined this way can be greater than 100% due to the formation of an intermetallic compound with greater density than the pure elements. For example, the sputtering target material has a density of about 100-107%. Preferably, the average level of porosity in the CIG sputtering target material should be 0 to 7 vol %, as determined by microstructural image analysis of representative cross sections, for example. More preferably, the average level of porosity may be 0 to 3 vol %. In addition, the CIG sputtering target material should not contain single inclusions or pores large enough to completely contain a 100 µm diameter sphere, preferably it should not contain single inclusions or pores large enough to completely contain a 50 µm sphere. In other words, single inclusions or pores, if present in the material, are small enough to only contain a sphere of less than 50 µm. Non limiting examples of single inclusions are foreign contaminants and/or oxide particles. In addition, the CIG sputtering target material should contain no pores or cracks having a distance of larger than 1000 µm when measured as straight linear distance between ends, more preferably not larger than 500 µm.

According to an embodiment, a die casting method is provided to produce a sputtering target. For example, the die casting method can be used to cast a sputtering target material, such as, for example, a copper indium gallium ("CIG") alloy, directly onto a backing structure, such as a cylindrical backing tube. Alternatively, die cast CIG segments may be formed by die casting, removed from the die cavity and then bonded to the backing tube.

Due to the volume change that occurs during solidification and thermal contraction of cast material, a substantial amount of shrinking is expected to occur after solidification of cast alloys using conventional methods. In particular, as discussed herein, CIG alloys being considered for use as sputtering target materials have a Cu—In ratio within a range of 0.66 to 1.50. As shown in the copper-indium phase diagram of FIG. 1, the solidification temperature range for such alloys is relatively wide, with a high temperature over 600° C. and temperatures decreasing until the solidus temperature of 306° C. is reached. In practice, equilibrium is never reached and practical solidus temperatures are generally below 200° C. for the alloys of interest. Such a wide temperature range is expected to produce a substantial amount of shrinking after solidification and cast parts having narrow sections and thin walled features would be expected to contain macro-porosity due to extensive solidification shrinkage. In addition, mold assemblies for articles having thin features, such as thin walls, present significant challenges for proper mold filling in conventional casting techniques due to the unstable flow of metal, air entrapment, and turbulent flow. These latter factors contribute to macro porosity formation in a cast article, cold shuts, hot tears, and poor mold filling, which provide sputtering targets with structural defects.

The present embodiment provides a die casting method to address these issues in the manufacture of a sputtering target. For example, a sputtering target with thin features, such as thin walls, can be produced. In addition, the sputtering target can have a substantially high form factor, for example, such as up to 300, for example 10-300, such as 100-250.

Figure 2A:
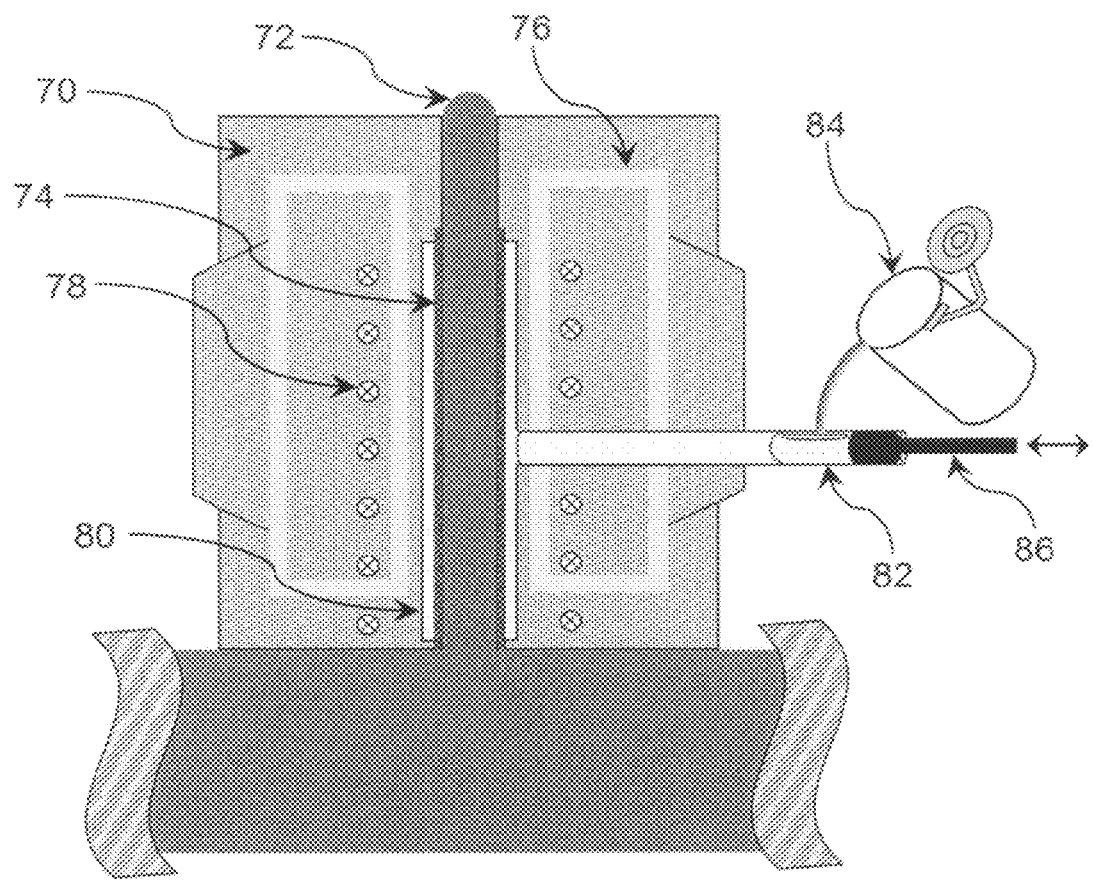
FIG. 2a is a side view of an exemplary die casting method for producing a sputtering target.

FIG. 2a shows an example of a die casting technique and apparatus for sputtering target materials, such as, for example, a CIG alloy. As shown in the example of FIG. 2a, an assembly can be provided that includes a die 70 and a backing tube support assembly 72 that supports and positions a backing tube 74. The backing tube 74 may comprise a tube of any suitable material, such as stainless steel, etc. The backing tube support assembly 72 can be inserted into an interior of the backing tube 74, as shown in the example of FIG. 2a, to support and position the backing tube 74 in die cavity 80. For example, the backing tube support assembly 72 can include a mandrel or other type of projection that is inserted into the interior of the cylindrical backing tube 74.

The die 70 can include at least one cooling channel 76 and at least one heating device 78, as shown in the example of FIG. 2a. The cooling channels 76 may comprise cooling fluid channels, such as water or any other cooling gas or liquid channels. The heating devices 78 can be, for example, electrically resistive elements, channels for the circulation of hot fluids, induction coils, or other heating devices used in the art. Such cooling channels 76 and/or heating devices 78 can be used to control the temperature profile of the die 70 and the solidification of sputtering target material introduced into the die 70, such as to control the resulting microstructure of sputtering target material cast in the die 70. For example, the heating devices 78 can be used to preheat the die 70, before and/or during die casting to ensure complete die filling. The cooling channels 76 can be used to quickly cool the die 70 after molten material has been delivered to the die cavity (i.e., after die casting) to control the temperature profile and solidification of the molten material introduced into the die 70, thus minimizing or preventing structural defects caused by porosity and undesirable microstructures in the cast material. Preferably, the sputtering target material is formed by rapid cooling of the CIG liquid sputtering target material on the backing structure at a rate of 1-100° C./s.

The assembly shown in the example of FIG. 2a can include a molten material source, such as a ladle 84. Molten material can be introduced from the molten material source to a shot chamber 82 that injects the molten material into a die cavity 80 within the die 70 via a plunger 86. The die cavity 80 of the die 70 can be formed between the backing tube 74 and the die 70 such that the die 70 forms an outer contour of the die cavity 80 while the backing tube 74 forms an inner contour of the die cavity 80.

Figure 2B:
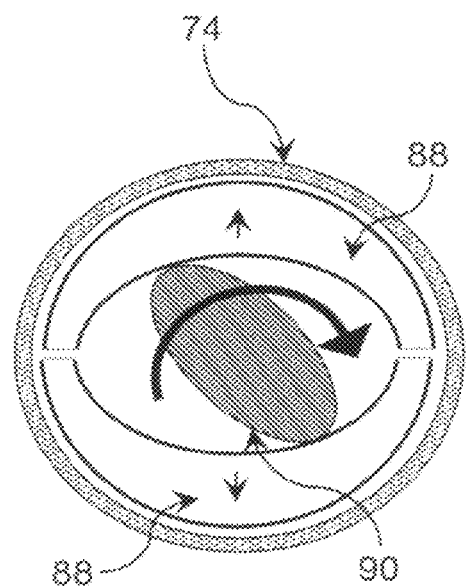
FIG. 2b is a top view of an exemplary backing tube support assembly for a die casting method.

FIG. 2b shows a top view of another example of a backing tube support assembly. In this example, the cylindrical backing tube 74 can be attached to a die tool by a positioning device comprising shells 88 brought into direct contact with the inner surface of the backing tube 74. The shells 88 can be made of any rigid, non-expandable material. As shown in the example of FIG. 2b, the shells 88 can cooperate to contact most of the inner surface of the backing tube 74, with a gap provided between the shells 88 so that the shells 88 may fit inside of the hollow space in the backing tube 74 and be placed in a position within the interior of the backing tube 74. Once in position within the backing tube 74, the shells 88 may be moved to contact the interior surface of the backing tube 74. For example, an elliptical camshaft 90 can be provided within a space formed between the shells 88 and rotated, such as in the direction indicated by arrow B in the example of FIG. 2b, to force the shells 88 against the interior surface of the backing tube 74, thus supporting and positioning the backing tube 74 in the die cavity 80. The backing tube 74 can be supported and positioned by other devices, such as, for example, spring-loaded mechanisms, expandable structures, and other devices used in the art.

The method of forming the CIG sputtering target material on the backing tube 74 described above results in the die cast target material being directly formed on the backing tube 74, preferably without the use of a bonding material between the target material and the backing tube 74. The entire cylindrical target material is die cast as a single piece of CIG material on the backing tube 74. The backing tube 74 with the cylindrical CIG target material formed on its outer surface is then removed from the die cavity 80.

While one example of a cold chamber die casting apparatus is shown in FIG. 2a, it should be noted that other die casting methods and apparatus may be used. For example, rather than using a single shot chamber 82 die casting apparatus shown in FIG. 2a, a multi-chamber apparatus may be used instead. In such an apparatus, the liquid CIG alloy is provided from a first chamber of the apparatus to the second shot chamber. The first chamber may comprise a melting furnace or a receiving chamber which receives the liquid metal from the melting furnace via a pipe or ladle. The second chamber may be the shot chamber 82.

In another alternative embodiment, rather than using a cold chamber die casting apparatus where a CIG alloy is melted into the liquid state in a melt furnace and then the liquid CIG alloy is poured into a shot chamber 82 (such as an unheated shot chamber), single chamber or multi-chamber hot chamber die casting apparatus may be used instead. For example, in a hot chamber die casting apparatus, a pool of molten CIG metal alloy is used to feed the die. At the beginning of the cycle, the plunger or piston of the machine is retracted, which allows the molten metal to fill the shot chamber which is located in the pool and/or which is fluidly connected to the pool of molten metal. The shot chamber in a hot chamber die casting apparatus is sometimes shaped as and referred to as a "gooseneck". However, other shot chambers may be used instead. The plunger then forces this metal out of the gooseneck into the die. The advantages of this hot chamber system include fast cycle times (approximately 15 cycles a minute) and the convenience of melting the metal in the casting machine.

Furthermore, while the shot chamber 82 is shown as being positioned horizontally adjacent to the side of the die 70 in FIG. 2a, other configurations may be used. For example, the shot chamber 82 may be positioned vertically below the die 70.

According to an alternative embodiment, segments of a target material may be separately cast in a die followed by bonding to the backing tube 74 rather than being directly cast as a single piece onto the backing tube 74 in one operation. Such an alternative process can advantageously use a smaller die assembly and be more cost effective, since it does not require inserting the backing tube support assembly 72 and the backing tube 74 into the die cavity 80. Segments of cast sputtering target material are bonded to the backing tube after being individually cast. Preferably, the die cast CIG segments have a shape of a hollow disc (i.e., a section of a hollow cylinder or a disc with flat major surfaces and a hole along the central axis large enough to accommodate the backing tube 74). Such segments may be formed in a die cavity having a hollow disc shape, where the central opening in the segment is formed by a protrusion which extends into the die cavity from one or both die.

Figure 3:
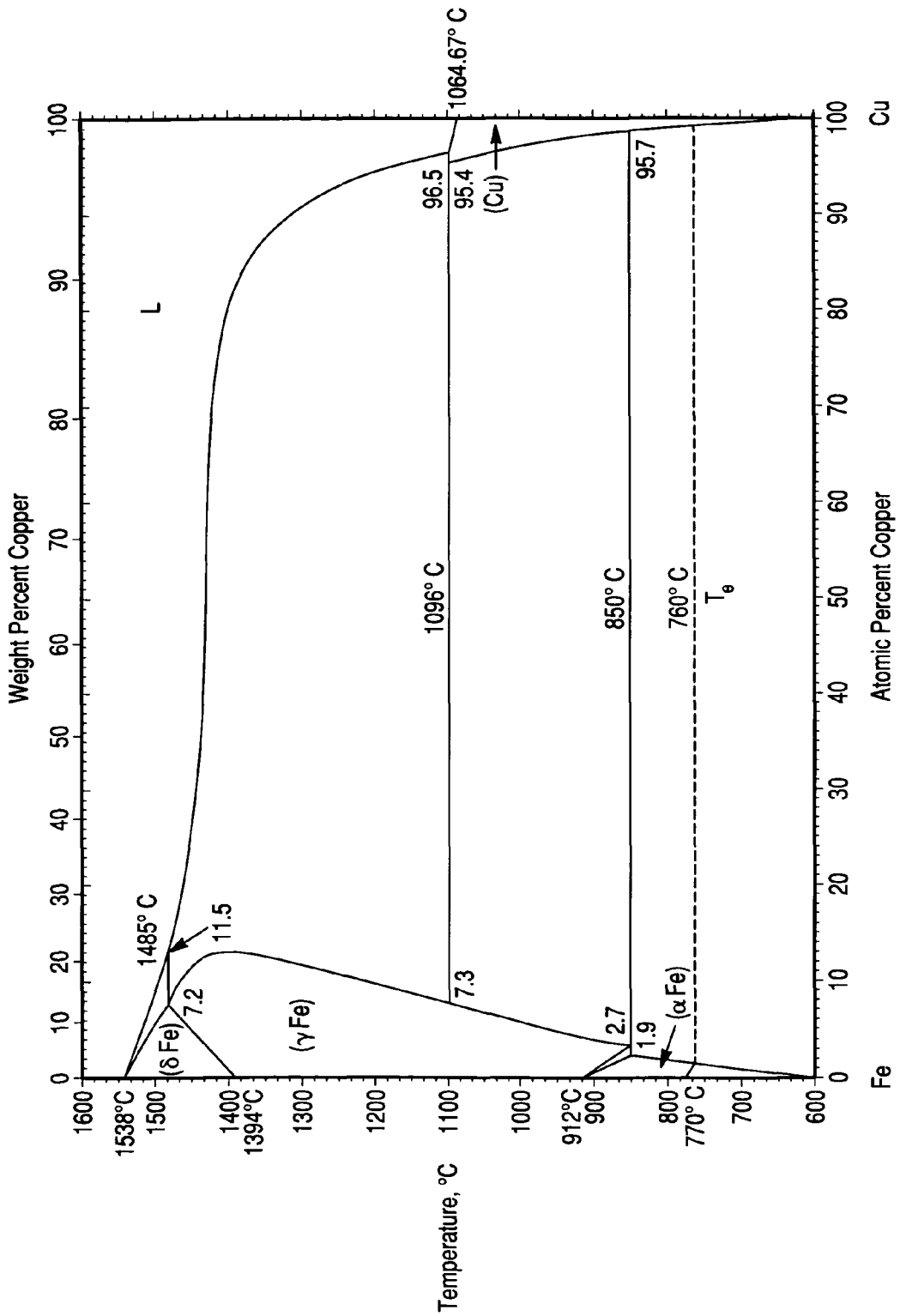
FIG. 3 is the iron-copper phase diagram.
Figure 4:
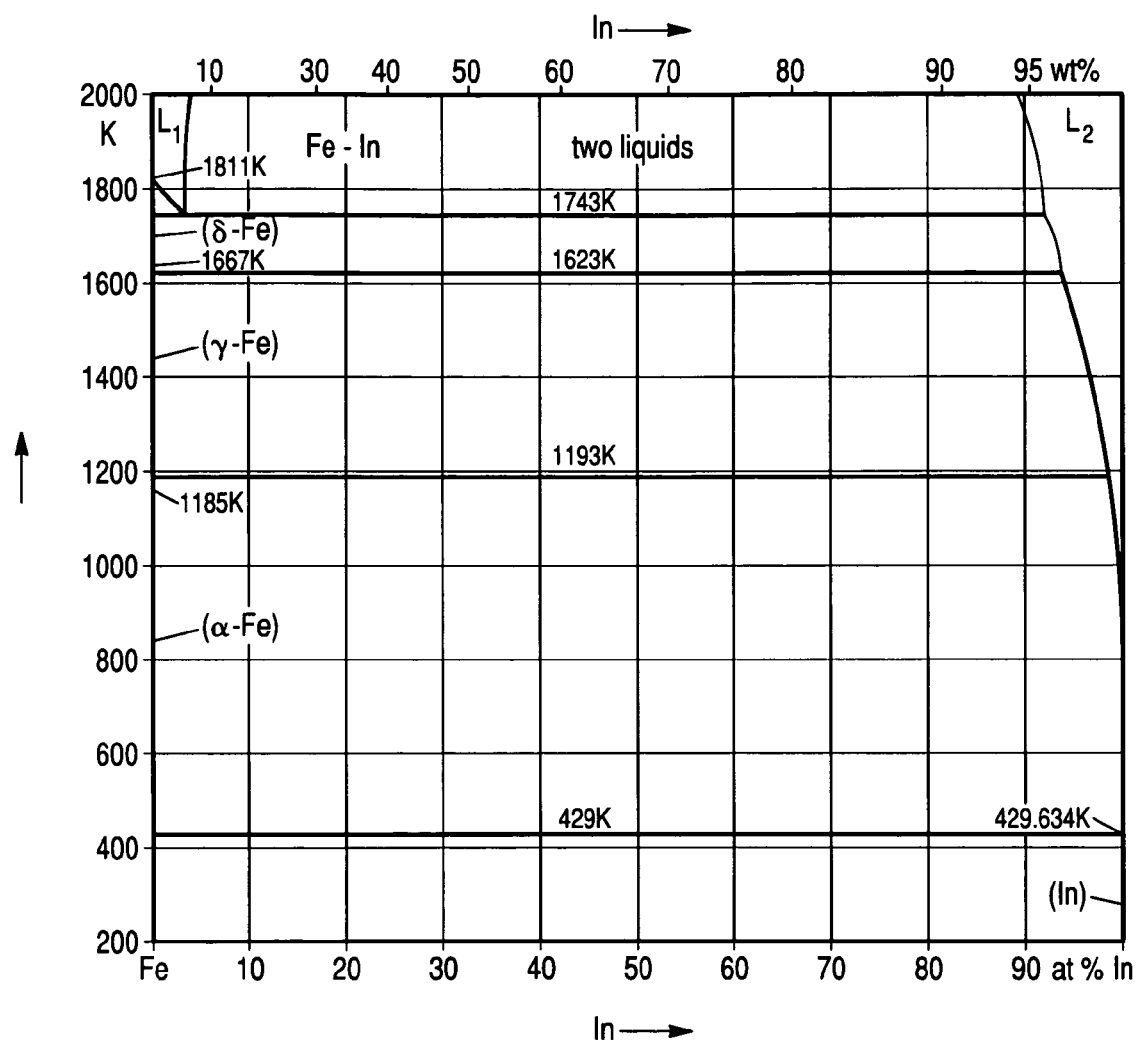
FIG. 4 is the iron-indium phase diagram.

As shown in FIG. 3, which is the iron-copper phase diagram, and in FIG. 4, which is the iron-indium phase diagram, diffusion bonds are unlikely to develop at an interface directly between a stainless steel backing structure and a CIG alloy sputtering target material because both copper and indium have very little solubility in iron. Therefore, one or more bond layers can be advantageously used to promote bonding between a sputtering target material, such as a CIG alloy, and a backing structure.

Such bond layer(s) can facilitate joining of sputtering target material, such as a CIG material, to the backing structure, such as a stainless steel backing tube. The bond layer strength may be in excess of 1000 pounds per square inch and the bond layer should be resistant to thermal cycling that is associated with sputtering processes that could otherwise cause in-service de-bonding of the CIG material from the backing structure and failure of the sputtering target.

The bond layer can cause diffusional bonding, such as between the sputtering target material and the bond layer and/or between the bond layer and the backing structure, such as when the temperature of the bond layer is high enough to cause inter-diffusion among the atomic species of the bond layer and the atomic species of the sputtering target material and/or the backing structure material.

Figure 5A:
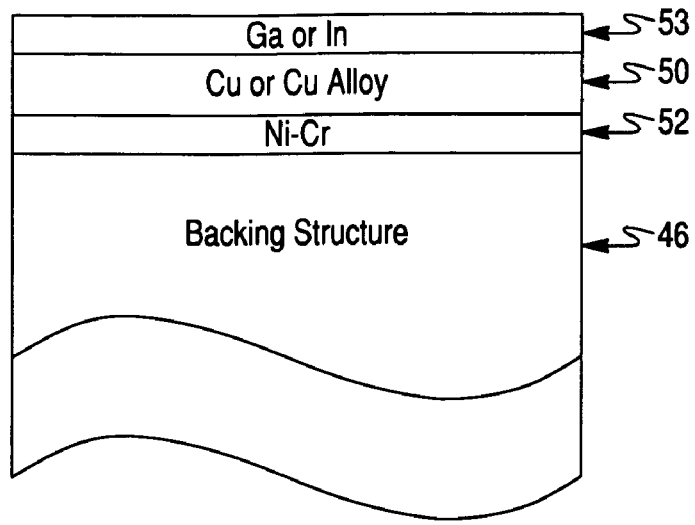
FIG. 5A is a side cross sectional view of an exemplary in-process sputtering target with a plurality of bond layers.
Figure 5B:
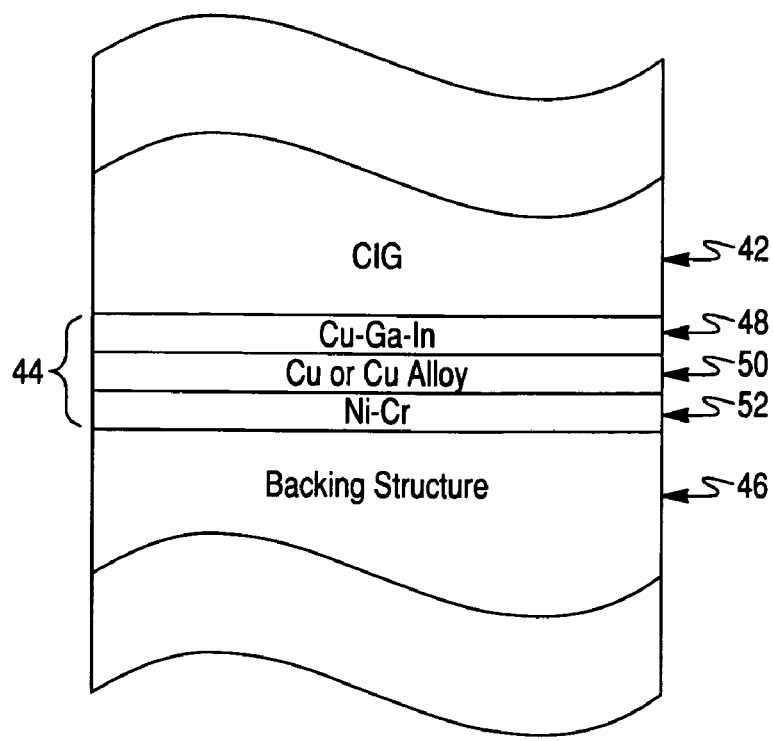
FIG. 5B is a side cross sectional view of an exemplary sputtering target with a plurality of bond layers.

FIG. 5A shows an in-process sputtering target while FIG. 5B shows the completed sputtering target made by the process of FIG. 5A. In the example of FIGS. 5A and 5B, a sputtering target 40 is provided that includes sputtering target material 42, a bond layer 44, and a backing structure 46. As shown in the example of FIG. 5B, the bond layer 44 can include multiple layers, with the various layers providing different properties and attributes to promote adhesion between the sputtering target material 42 and the backing structure 46 and to minimize or prevent diffusion from the backing structure into the sputtering target material.

A bond layer can be formed of any one or more layers of material(s) that promotes the development of a diffusion bond at the interface between the sputtering target material and the bond layer. Such a bond layer(s) 44 can include, for example, a copper or a copper alloy compatible layer 50. The compatible layer can also act as a diffusion barrier layer to advantageously prevent the material of the backing structure 46 from dissolving into the sputtering target material 42, such as a CIG alloy. The materials of the stainless steel backing structure, such as, for example, iron, chromium, and nickel, can adversely affect the performance of photovoltaic cells if incorporated into a sputtered CIGS absorber layer.

The bond layer 44 can also include an optional bond coat layer 52 that strongly adheres to the backing structure 46 and provides a compatible bonding material for overlaying layers, such as a Cu or Cu alloy compatible layer 50. The bond coat layer 52 can be made of, for example, any suitable material which bonds to both the compatible layer 50 and the backing structure 46. For example, the bond coat layer 52 may comprise a nickel or aluminum alloy layer, such as nickel-chromium, nickel-copper or aluminum-copper bronze, and other non-ferromagnetic metals and alloys used in the art.

While a stainless steel backing structure 46 is described above, it should be noted that the backing structure may be made of other materials, such as aluminum or copper or Al or Cu alloys. In cases where the adhesion of the compatible layer 50 to the backing structure 46 is sufficiently strong, the optional bond coat layer 52 may be omitted. For a Cu or Cu alloy backing structure 46, both the compatible layer 50 and the optional bond coat layer 52 may be omitted.

Casting of the CIG sputtering target material 42 may require a pre-heated backing structure to promote interdiffusion of the sputtering target material and the material of the backing structure. However, such pre-heating could lead to oxidation of the bond layer, such as when the bond layer includes copper or a copper alloy compatible layer and/or to oxidation of the backing structure if the backing structure itself is made from a copper or copper alloy. Thus, the bond layer (or the Cu or Cu alloy backing structure) may be protected by a protective coating or may be processed under a protective atmosphere, such as a vacuum, low pressure vacuum, or inert atmosphere. As shown in FIG. 5A, the protective coating can be, for example, a layer 53 of gallium, indium or both gallium and indium (e.g., In—Ga alloy). Such layers of gallium and/or indium are capable of resisting oxidation at high temperature in open air and can produce strong bonds with the sputtering target material, such as a CIG alloy. The protective coating is preferably applied as a liquid film that wets the surface of the Cu or Cu alloy. Such a liquid film can advantageously enhance wetting of the bond layer by the sputtering target material, such as when molten sputtering target material 42 is cast onto the bond layer 44, thus promoting a more efficient diffusion bonding process. The liquid In and/or Ga protective coating 53 may solidify after application, and only liquefy again later when molten CIG target material 42 is applied. Therefore, the subsequent step of forming the diffusion bond does not require the In and/or Ga coating 53 to remain liquid between its application and the pouring of the molten CIG target material 42. In an alternative embodiment, the protective coating 53 may be applied by some other method, such as sputtering.

Figure 6:
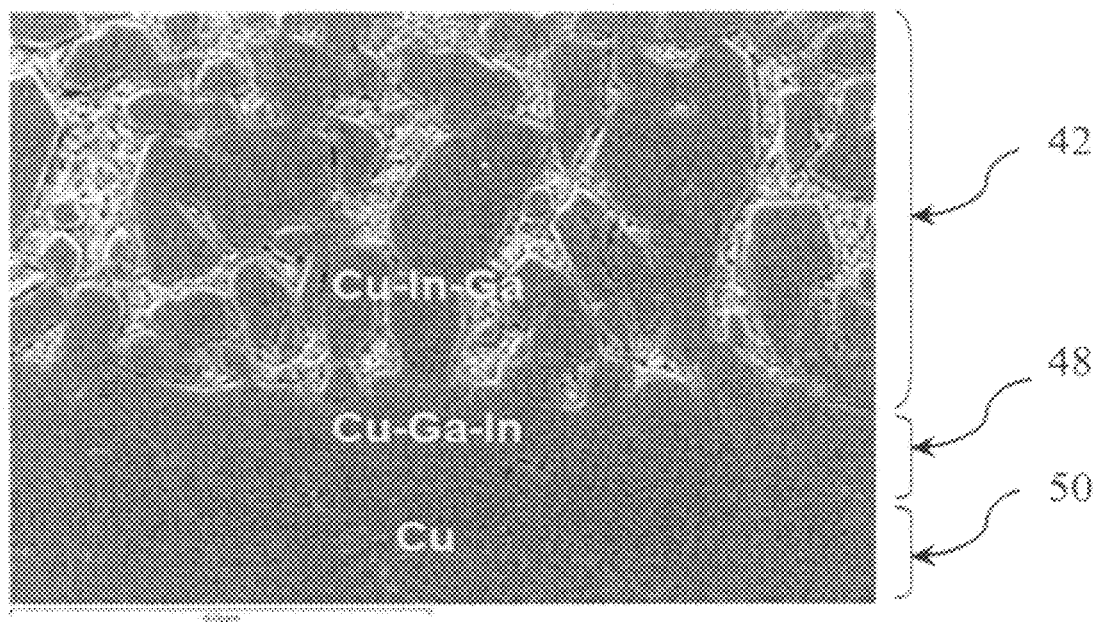
FIG. 6 is a micrograph showing a side cross section view of an exemplary sputtering target including compatible layer and a diffusion bond layer.

As shown in FIG. 6B, the CIG sputtering target material 42 is formed over the protective coating 53 and the protective coating 53 is converted to a diffusion bond layer 48 which promotes adhesion of the sputtering target material 42 to the underlying layers, such as the compatible layer 50. For example, the layers may be processed, such as by heating the layers to an elevated temperature during casting and/or after casting, to promote interdiffusion through the diffusion bond layer 48 of the constituents of the sputtering target material 42 and/or the compatible layer 50. Thus, it is believed that Cu from the compatible layer 50 and/or from material 42 to produce a diffusion bond layer 48 including Cu and at least one of In and Ga between the sputtering target material 42 and the compatible layer 50. FIG. 6 is a micrograph showing a side cross section view of an exemplary sputtering target including sputtering target material 42, a compatible layer 50, and a diffusion bond layer 48. The compatible layer 50 is made of copper, the diffusion bond layer 48 includes Cu, Ga and In, and the target material 42 comprises CIG.

The layers 53, 50 and/or 52 can be deposited by any suitable techniques used in the art such as, for example, thermal deposition, electro- or electro-less plating, chemical or physical vapor deposition (CVD or PVD). Preferably, protective coating 53 is applied in molten form by brush. In another example, when a bond layer 44 includes various layers, such as a bond coat layer 52, a compatible layer 50, and a protective coating 53, the various layers can be deposited by different techniques or the same technique. For example, the bond coat layer 52 can be deposited by thermal spray while the protective coating 53 may be deposited by dipping the structure into liquid In and/or Ga.

In another example, cast segments are bonded to the backing tube 74 with an intermediate bonding layer of indium. The indium bonding layer is applied to the outer surface of the backing tube 74 and/or to the inner surfaces or inner diameters of the hollow disc shaped CIG segments. However, such a process requires heating the segments above the melting point of indium, 156° C., which approximates the solidus temperature for many CIG alloys of interest, thus resulting in partial melting of many CIG alloys during the bonding process.

An alternative bonding process uses an alloy of indium and gallium that melts at a temperature below 156° C. The composition of the alloy can be modified to provide a melting point between 16° C. and 156° C., and may include 10-90 atomic percent In and 90-10 atomic percent Ga. Optionally, one or more other alloying elements may be added. One issue to consider when using such bonding alloys is the possibility of atoms of the cast segment diffusing into the bonding alloy, thus changing the composition and properties of the bonding alloy and vise-versa. To avoid this, a thin layer of barrier material may be deposited on areas of the segment where there such a concern, such as the inner diameter of the segment. Such a barrier layer can be made of any non-ferromagnetic metal with a melting point above the bonding temperature, such as, for example, Cu, Ti, Ta, Zr, Sn, Zn, V, Nb, Mo, their alloys or 300 series stainless steel. Al is not a desirable bonding material for segments cast from CIG alloys because Al can be embrittled by gallium.

According to another example, the die casting method described herein can be used to make a planar sputtering target. For example, a flat backing support assembly can be provided to support a planar backing structure rather than a backing tube, with molten material being applied to a surface of the supported planar backing structure.

By using the die casting method described herein a sputtering target is produced with a high density, low residual porosity, a composition with a relatively high uniformity, and a microstructure having fine, equiaxed grains. The terms "liquid" and "molten" are used interchangeably herein with the understanding that the metal injected into the die cavity may have a small amount of solid phase.

It is to be understood that the present invention is not limited to the embodiment(s) and the example(s) described above and illustrated herein, but encompasses any and all variations falling within the scope of the appended claims. While a pure CIG alloy is described above, it should be noted that the CIG alloy may contain other alloying elements. For example, the alloy may contain Na, Al and/or Se in addition to copper, indium and gallium.

What is claimed is:

1. A method of making a sputtering target, comprising:
   providing a backing structure, and
   forming as cast die cast copper indium gallium sputtering target material on the backing structure.

2. A method as claimed in claim 1, wherein the sputtering target material is formed by die casting the entire sputtering target material directly onto the backing structure comprising a cylindrical backing structure to form a cylindrical sputtering target.

3. A method as claimed in claim 2, further comprising placing the cylindrical backing structure in a die cavity and injecting liquid copper indium gallium sputtering target material into the die cavity.

4. A method as claimed in claim 3, wherein the step of placing the cylindrical backing structure in the die cavity comprises placing a positioning device inside a hollow space in the cylindrical backing structure and contacting an inner surface of the cylindrical backing structure while the backing structure is located in the die cavity.

5. A method as claimed in claim 4, wherein the positioning device comprises at least two shells and a cam shaft located between the shells.

6. A method as claimed in claim 1, wherein the sputtering target material is formed by die casting the sputtering target material in a liquid state into a die cavity to form at least one hollow disc segment followed by removing the at least one segment from the die cavity and bonding the at least one segment to a cylindrical backing structure.

7. A method as claimed in claim 6, wherein the step of bonding the at least one segment to a cylindrical backing structure comprises bonding a plurality of segments to the backing structure using an indium or an indium-gallium allot bonding material.

8. A method as claimed in claim 7, further comprising forming a barrier material on an inner surface of each segment.

9. A method as claimed in claim 1, further comprising heating a die before or during the step of the casting followed by cooling the die after the step of die casting.

10. A method as claimed in claim 1, wherein the backing structure has a planar shape.

11. A method as claimed in claim 1, wherein;
from 0% to 10% of primary phase regions in the sputtering target material are of a size greater than 100 μm in any random 1 cm by 1 cm area of the sputtering target;
an average primary phase region in the sputtering target material is of a size not greater than 40 μm; and
the sputtering target material has an overall uniform composition.

12. A method as claimed in claim 1, wherein:
from 0% to 10% of primary has regions in the sputtering target material are of a size greater than 50 μm in any random 1 cm by 1 cm area of the sputtering target;
an average primary phase region in the sputtering target material is of a size between 1 and 25 μm; and
the sputtering target material has an overall uniform composition.

13. A method as claimed in claim 1, wherein:
from 1% to 5% of primary phase regions in the sputtering target material are of a size greater than 50 μm in any random 1 cm by 1 cm area of the sputtering target;
an average primary phase region in the sputtering target material is of size between 10 and 20 μm; and
the sputtering target material has an overall uniform composition.

14. A method as claimed in claim 1, wherein the sputtering target material has an overall uniform composition of about 29-39 wt % copper, about 49-62 wt % indium, and about 8-16 wt % gallium.

15. A method as claimed in claim 1, wherein:
the sputtering target material has a density of 100% to 107% as determined by a rule of mixtures;
the sputtering target material contains 0 to 7 vol % porosity;
the sputtering target material does not contain inclusions or pores greater than a 100 μm diameter sphere in size; and
the sputtering target material does not contain pores or cracks having a distance larger than 1000 μm.

16. A method as claimed in claim 1, wherein:
the sputtering target material has a density of 100% to 107% as determined by a rule of mixtures;
the sputtering target material contains less than 0 to 3 vol % porosity;
the sputtering target material does not contain inclusions or pores greater than a 50 μm diameter sphere in size; and
the sputtering target material does not contain pores or cracks having a distance larger than 500 μm.

17. A method as claimed in claim 1, wherein the sputtering target material is formed by rapid cooling of the liquid sputtering target material on the backing structure at a rate of 1-100° C./s.

18. A method as claimed in claim 1, further comprising forming at least one bonding layer between the backing structure and the sputtering target material.

19. A method as claimed in claim 18, wherein:
the step of forming the at least one bonding layer comprises forming a Cu or Cu alloy compatible layer over the backing structure and forming a protective liquid In, Ga or In—Ga alloy film over the compatible layer; and
the In, Ga or In—Ga alloy film forms a Cu—In—Ga diffusion bond layer between the copper indium gallium sputtering target material and the compatible layer.

20. A method as claimed in claim 19, wherein:
the backing structure comprises a stainless steel backing structure.

21. A method as claimed in claim 20, wherein:
the step of forming the at least one bonding layer further comprises forming a nickel or aluminum alloy bond coat layer between the compatible layer and the backing structure.

22. A method as claimed in claim 18, wherein:
the step of forming the at least one bonding layer comprises forming a protective liquid In, Ga or In—Ga alloy film over a Cu or Cu alloy backing structure; and
a Cu—In—Ga diffusion bond layer is formed between the copper indium gallium sputtering target material and the backing structure.

* * * * *